United States Patent [19]
Shinagawa

[11] Patent Number: 6,053,950
[45] Date of Patent: Apr. 25, 2000

[54] LAYOUT METHOD FOR A CLOCK TREE IN A SEMICONDUCTOR DEVICE

[75] Inventor: Naoko Shinagawa, Tokyo, Japan

[73] Assignee: NEC Corporation, Tokyo, Japan

[21] Appl. No.: 09/023,208

[22] Filed: Feb. 13, 1998

[30] Foreign Application Priority Data

Feb. 13, 1997 [JP] Japan .................................. 9-044721

[51] Int. Cl.$^7$ ................................................ G06F 17/50
[52] U.S. Cl. .................................... 716/2; 716/6; 716/18; 703/19
[58] Field of Search ..................... 395/500.07, 500.03, 395/500.13, 500.06; 714/731

[56] References Cited

U.S. PATENT DOCUMENTS

| | | | |
|---|---|---|---|
| 5,452,239 | 9/1995 | Dai et al. ............................. | 395/500.4 |
| 5,638,291 | 6/1997 | Li et al. .............................. | 395/500.19 |
| 5,799,170 | 8/1998 | Drumm et al. ..................... | 395/500.03 |
| 5,864,487 | 1/1999 | Merryman et al. ................. | 395/500.07 |

FOREIGN PATENT DOCUMENTS 3-232267 10/1991 Japan .
5-54100 3/1993 Japan .

OTHER PUBLICATIONS

Cho et al, "A Buffer Distribution Algorithm for High–Performance Clock Net Optimization", IEEE Transactions on Very Large Scale Integration (VLSI) Systems, pp. 84–98, Mar. 1995.

Brasen et al, "Post–Placement Buffer Reoptimization", IEEE Proceedings of Euro ASIC '92, pp. 156–161, Jun. 1992.

*Primary Examiner*—Eric W. Stamber
*Assistant Examiner*—Samuel Broda
*Attorney, Agent, or Firm*—Foley & Lardner

[57] ABSTRACT

A clock signal distribution circuit has a clock tree configuration. In the layout of the clock tree, a standard clock tree is prepared having a route buffer, a plurality of intermediate stage buffer cells and a plurality of last stage buffer cells connected in a hierarchical configuration. All of the clock lines have an equal length. If there are no set of flip-flops ina target integrated circuit corresponding to a set of last stage buffer cells, the set of last stage buffer cells are removed as a whole provided there is not other last stage buffer cells connected to a flip-flop.

5 Claims, 6 Drawing Sheets

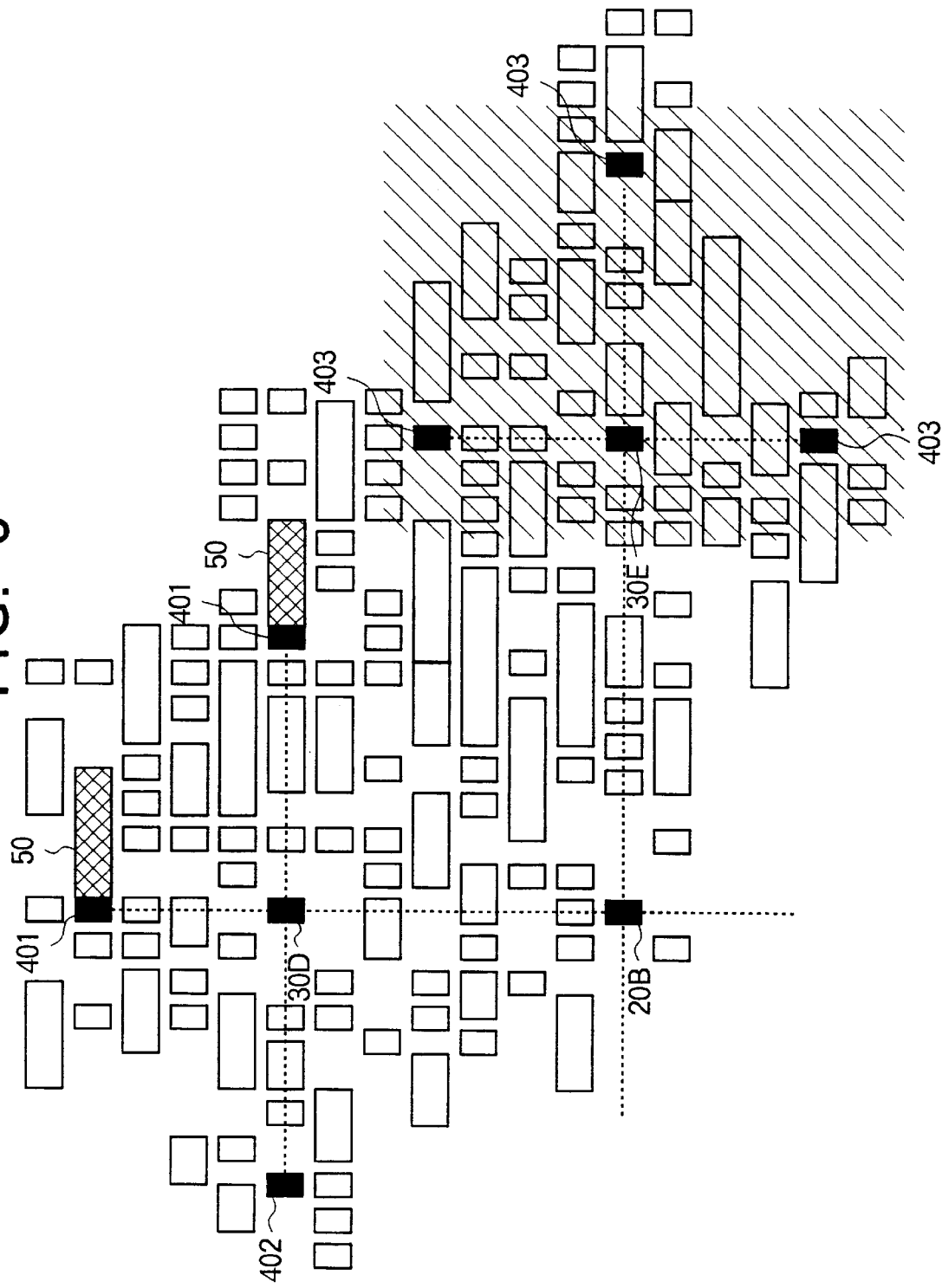

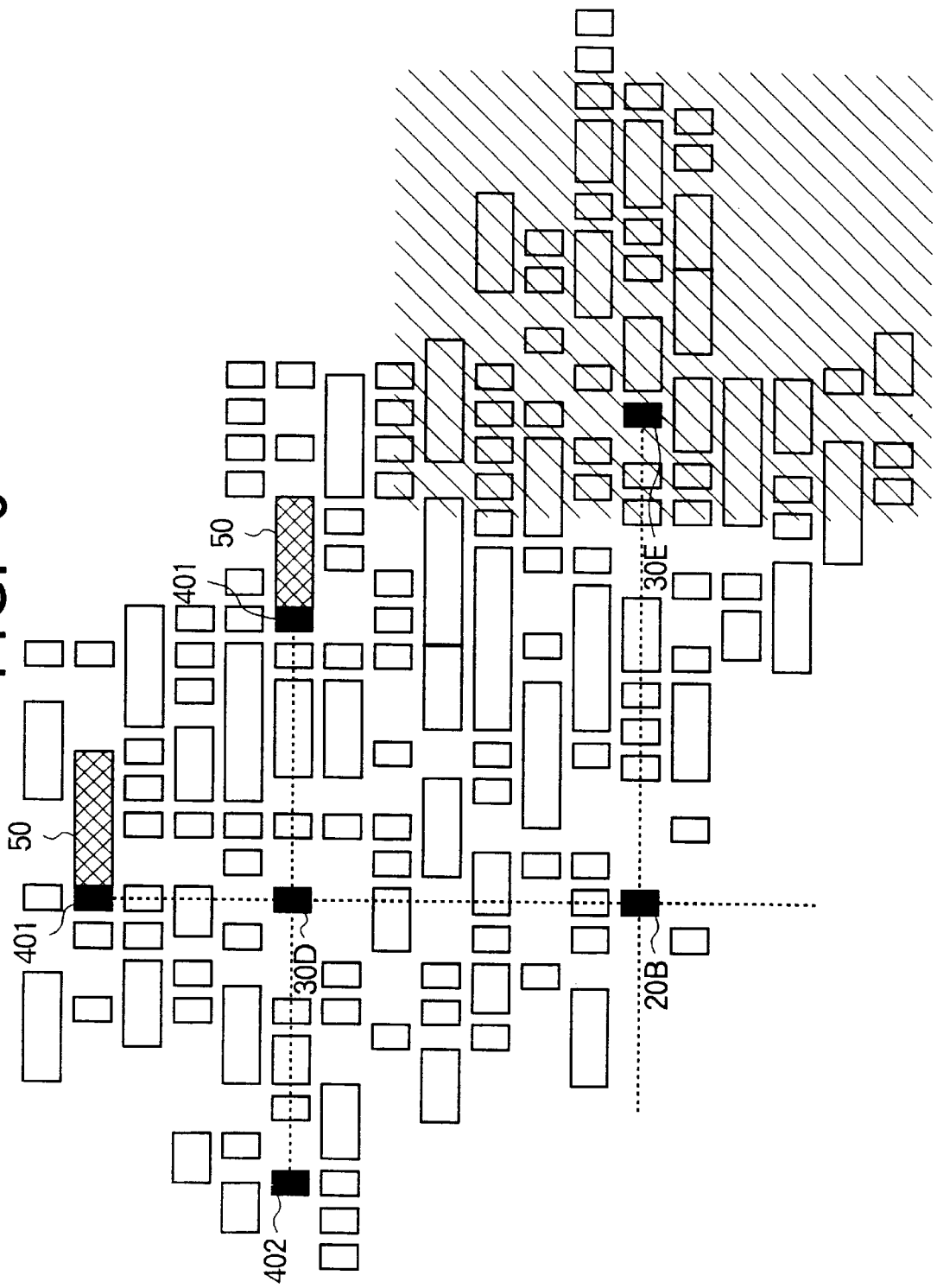

LAYOUT METHOD FOR A CLOCK TREE IN A SEMICONDUCTOR DEVICE

BACKGROUND OF THE INVENTION (a) Field of the Invention

The present invention relates to a layout method for a clock tree in a semiconductor device and, more particularly, to a technique for reduction of a clock skew in a clock signal distribution circuit.

(b) Description of the Related Art

Clock signal distribution circuit is generally used in a semiconductor integrated circuit for driving flip-flops or latches (hereinafter, referred to simply as flip-flops) in synchrony with one another. It is important to reduce the clock skew between clock signals supplied to the individual flip-flops for achieving a reliable operation of the semiconductor integrated circuit.

Patent Publication JP-A-3(1991)-232267 describes a clock signal distribution circuit formed as a mesh clock circuit having a mesh clock net for reducing the clock skew therein. In the proposed clock circuit, each clock branch connected to the input of a flip-flop is derived from the mesh clock net which is disposed over the entire chip area. The mesh clock net has a large line width for reduction of propagation delay of the clock signal.

In the proposed configuration, however, a clock skew remains in the mesh clock circuit because the line length from the clock receiver or root buffer to the respective flip-flops are not equal to one another. In addition, the mesh clock net generally includes unnecessary clock lines which have a large line width to thereby occupy a large chip area.

Patent Publication JP-A-5-54100 proposes a binary-tree clock signal distribution circuit, called clock-tree synthesis, wherein a computer-aided design (CAD) uses a specific technique to interpose relaying buffer drivers in the clock lines and to equalize the propagation delay from the clock receiver to the flip-flops for reduction of the clock skew. To equalize the propagation delay, the clock branches have detours to obtain a substantially equal length of the branches. In this publication, a tree configuration is first assumed in its entirety including a plurality of hierarchical clock nodes each having a plurality of branches extending therefrom.

The tree configuration is then determined in its exact location from a lower level to a higher level of the clock lines, so as to dispose the clock lines having a common node and a corresponding lower level node to have an equal length. The tree configuration is also determined in its location so that a plurality of buffer drivers disposed at the same level have an equal propagation delay by introducing detours in the clock lines.

In the proposed clock-tree synthesis, it is generally difficult or substantially impossible to equalize the loads for the buffer drivers, and accordingly, a significant clock skew still remains in the clock signal distribution circuit.

SUMMARY OF THE INVENTION

It is an object of the present invention to provide a layout method for a clock signal distribution circuit in a semiconductor device, having a tree configuration and capable of reducing the clock skew to obtain a reliable operation of the semiconductor integrated circuit operating with the clock signal supplied from the clock tree.

The present invention provides a layout process for a clock signal distribution circuit in a semiconductor device comprising the steps of: preparing at least one standard clock tree including a rout buffer, a plurality of buffer cells inclusive of last stage buffer cells, and a set of clock lines connecting the rout buffer and the buffer cells in a hierarchical format, the clock lines having an equal length to one another; expanding the standard clock tree on a chip area stored in a CAD system; expanding a target integrated circuit on the chip area so that flip-flops in the target integrated circuit correspond to the respective last stage buffer cells; removing from the standard clock tree a set of buffer cells having no corresponding set of flip-flops or succeeding buffer cells on condition that none or all of the buffer cells connected to a common preceding buffer cells are removed, and connecting remaining last stage buffer cells to respective flip-flops.

In accordance with the clock signal distribution circuit of the present invention, since all of the individual clock lines have a substantially equal length and buffer cells arranged on the same number of stages have uniform load at their output, the clock skew between the clock lines of the same level and between the flip-flops can be substantially eliminated.

The above and other objects, features and advantages of the present invention will be more apparent from the following description, referring to the accompanying drawings.

BRIEF DESCRIPTION OF THE DRAWINGS

FIG. 5 is a schematic top plan view of a chip area before removal of the unused buffer cells; and FIG. 6 is schematic top plan view of a chip area after removal of the unused buffer cells.

PREFERRED EMBODIMENTS OF THE INVENTION

Now, the present invention is more specifically described with reference to accompanying drawings.

Figure 1:
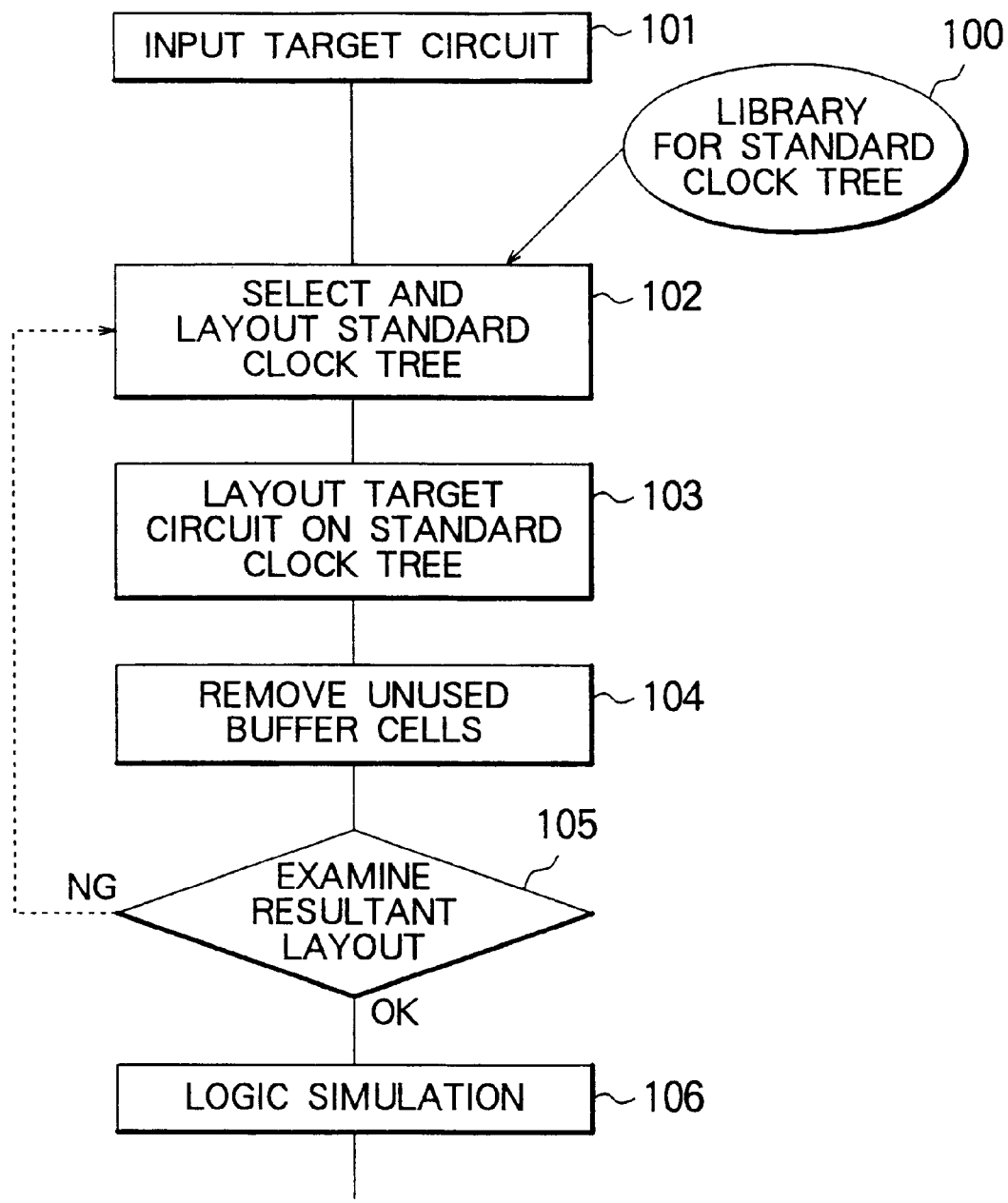
FIG. 1 is a flowchart of a layout process according to an embodiment of the present invention.

Referring to FIG. 1 showing a layout process for a clock signal distribution circuit according to an embodiment of the present invention, a layout system in a CAD system for designing the semiconductor integrated circuit to implement the layout process comprises a library 100 for storing data of standard clock trees, each of which defines a standard clock signal distribution circuit for a specific type of semiconductor integrated circuits or gate arrays. In each of the standard clock trees, a plurality of clock lines connecting a rout buffer and a plurality of buffer cells in a hierarchical format or a tree configuration have an equal line length. Before describing the steps of FIG. 1, the configuration of the standard clock trees will be described below.

Figure 2:
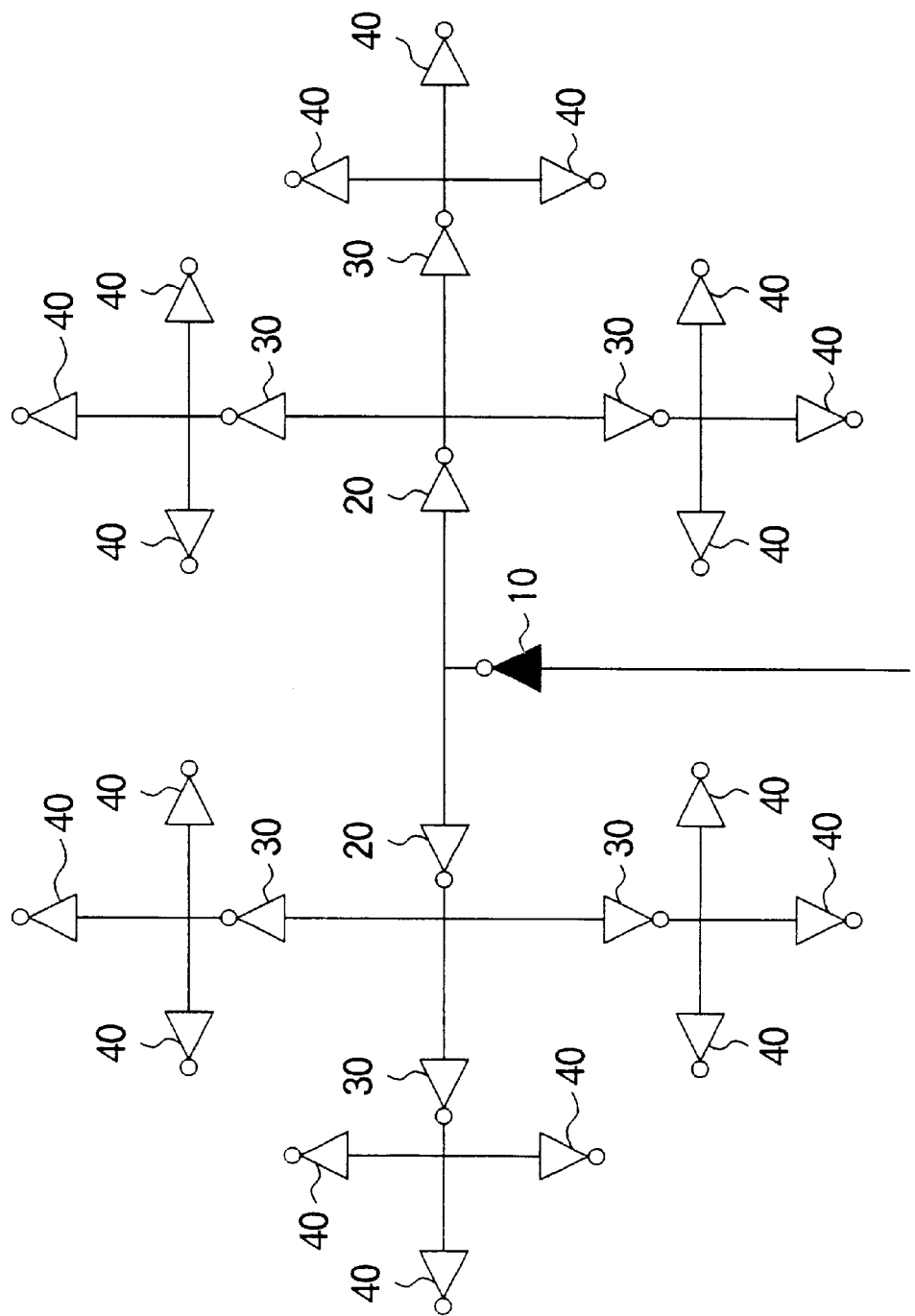
FIG. 2 is a configuration of an example of standard clock trees stored in a library.

Referring to FIG. 2, there is shown an example of the standard clock trees stored in the library 100. The standard clock tree comprises a rout buffer or clock receiver 10 receiving a main clock signal from outside the chip, a plurality (pair in this example) of first stage buffer cells 20 each receiving an output from the rout buffer 10, a plurality of (3 in this example) second stage buffer cells 30 each receiving an output from a corresponding one of the first stage buffer cells 20, and a plurality of (3 in this example)

final stage buffer cells each receiving an output from a corresponding one of the second stage buffer cells 30 and having an output to be connected to the input of a corresponding flip-flop. All of the clock lines disposed between a rout buffer and a first stage buffer cell and between each buffer cell and a succeeding buffer cell have an equal length.

Back to FIG. 1, in step S101, data for an object (or target) integrated circuit are input to the layout system of the CAD. The layout system then selects one of the standard clock trees in step S102 from the library 100 based on the type and dimensions of the chip of the object integrated circuit. The layout system then expands the selected standard clock tree on a chip area on the CAD system.

In step S103, the data of the object integrated circuit is expanded on the chip area of the clock tree in the CAD system so that all flip-flops in the integrated circuit are overlapped with the respective final stage buffer cells. If it is found that any set of final buffer cells are not overlapped with a corresponding set of flip-flops, the set of buffer cells are deleted in step S104 provided that the loads for the entire buffer cells including from rout buffer to the final stage buffer cells remaining in the clock tree to feed the clock signal to the flip-flop are not changed. This condition can be met if there is no other buffer cell connected to an output of a preceding buffer cell to which the set of buffer cells to be removed are connected.

Figure 3:
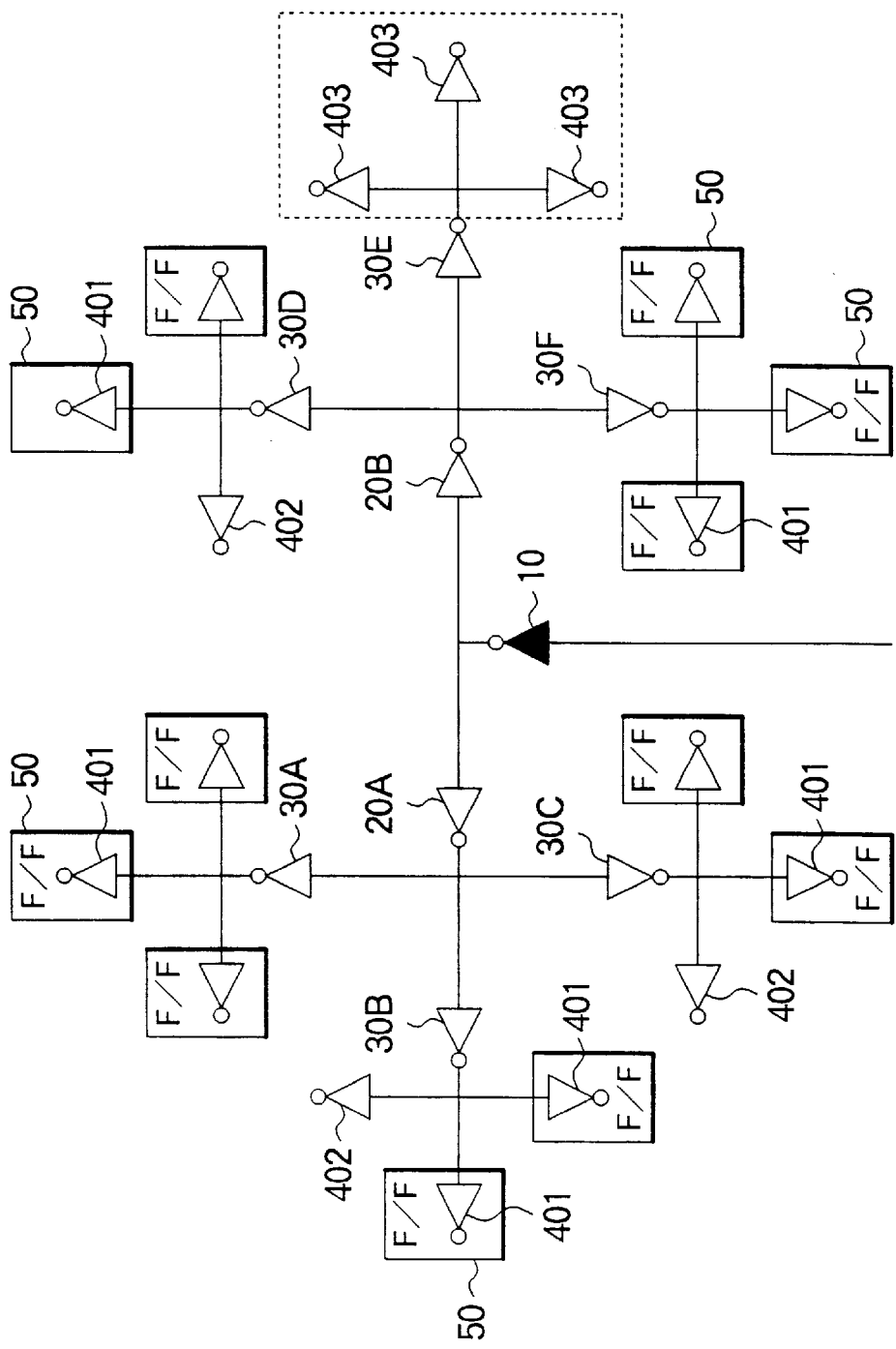
FIG. 3 shows the clock tree of FIG. 2 after the step of overlapping by flip-flops of a target circuit.

Referring to FIG. 3, there is shown the clock tree of FIG. 2 after the overlapping by the flip-flops in the target integrated circuit. In this example, a plurality of final stage buffer cells 402 are not overlapped with flip-flops 50, i.e., have no load therefor, and the respective preceding buffer cells 30B, 30C and 30D have other succeeding buffer cells 401 which are overlapped with respective flip-flops 50. In this case, the final stage buffer cells 402 are not removed although they have no load therefor.

Figure 4:
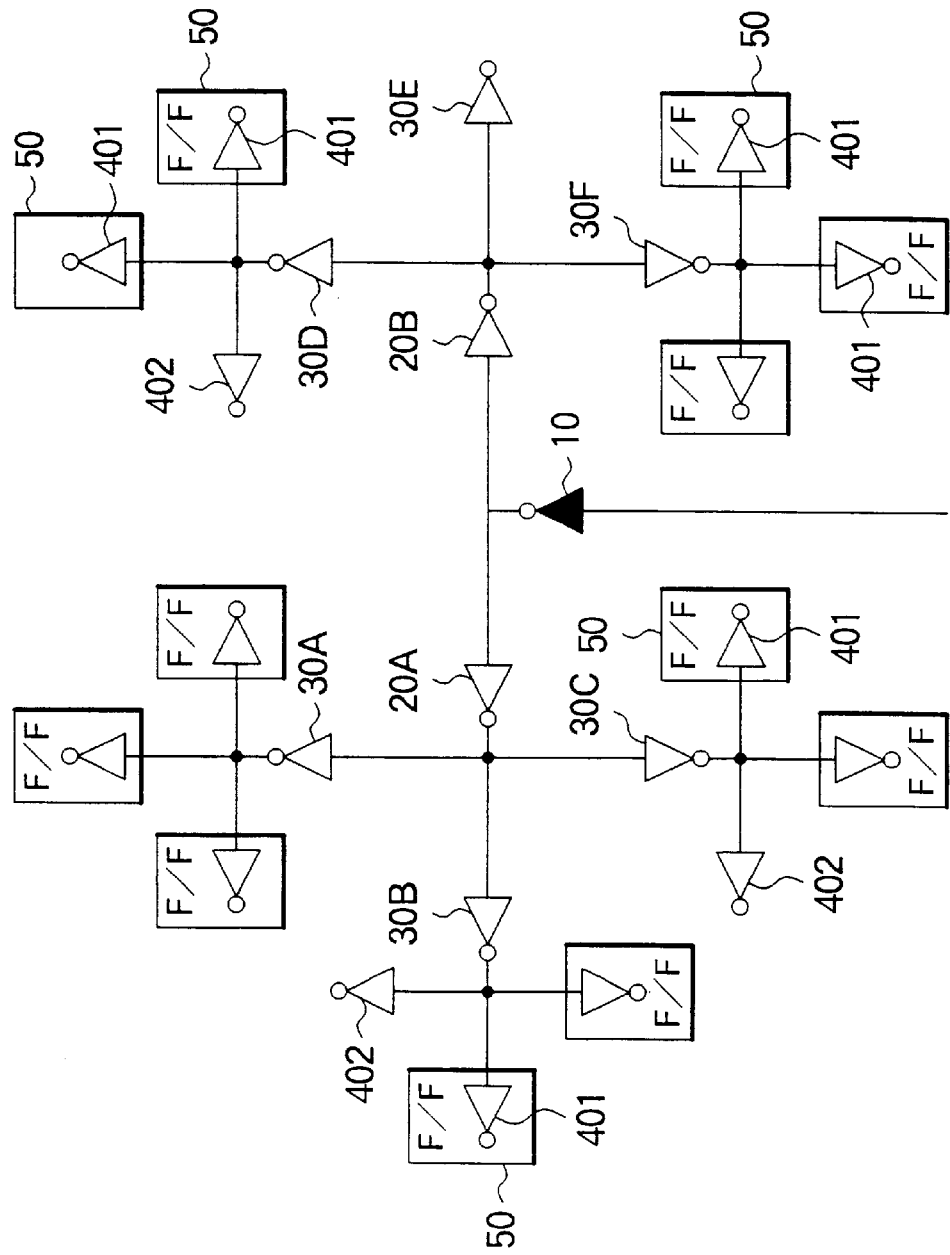
FIG. 4 shows the clock tree of FIG. 3 after the step of removal of unused buffer cells.

On the other hand, a set of buffer cells 403 connected to a common preceding buffer cell 30E and encircled by a dotted box in FIG. 3 are not overlapped with flip-flops 50, and there is no other buffer cell connected to the output of the preceding buffer cell 30E. In this case, the set of final stage buffer cells 403 are removed from the clock tree, as shown in FIG. 4. In FIG. 4, the preceding buffer cell or second stage buffer cell 30E is not removed from the clock tree for the reason as described in connection with the last stage buffer cells 402. The removal of the buffer cells are effected to the entire clock tree.

FIGS. 5 and 6 illustrate portions of the layouts on the chip in the CAD corresponding to the clock trees of FIGS. 3 and 4, respectively. In FIG. 5, the block shown by hatching has no flip-flops therein and the final stage buffer cells 403 are to be removed. In another block, last stage buffer cell 402 having no load is to be left on the chip. The resultant layout for the clock tree is shown in FIG. 6.

In step 105 of FIG. 1, if there is a major error in the layout for the clock tree shown in FIG. 4, such as a trouble wherein the space for most of the clock lines cannot be obtained or the standard clock tree does not provide a sufficient number of final stage buffer cells, the step returns to step 102 wherein another one of the standard clock trees is selected and similar steps are repeated from step 101 to step 105 to the another standard clock tree. If there is a minor error in step 105, such as the case wherein one or some of the clock lines does not find its space, the arrangement on the chip is modified in step 105. If it is found in step 105 that there is no error in the layout, a logic simulation is effected in the resultant integrated circuit in step 106 to assure the normal operation of the integrated circuit.

Since the above embodiments are described only for examples, the present invention is not limited to the above embodiments and various modifications or alterations can be easily made therefrom by those skilled in the art without departing from the scope of the present invention.

What is claimed is:

1. A layout process for a clock signal distribution circuit in a semiconductor device comprising:

preparing at least one standard clock tree including a rout buffer, a plurality of buffer cells inclusive of last stage buffer cells, and a set of clock lines connecting said rout buffer and said buffer cells in a hierarchical format, said clock lines having an equal length to one another;

expanding said standard clock tree on a chip area stored in a CAD system;

expanding a target integrated circuit on said chip area so that flip-flops in said target integrated circuit corresponding to respective said last stage buffer cells;

removing from said standard clock tree a set of said buffer cells having no corresponding set of flip-flops or succeeding buffer cells on condition that none or all of the buffer cells connected to a common preceding buffer cells are removed; and connecting remaining last stage buffer cells to respective flip-flops.

2. A layout process as defined in claim 1, wherein said removing is followed by examining the clock lines remaining in the chip area after said removing to determine whether a clock tree layout error has occurred.

3. A layout process as defined in claim 2, wherein said at least one standard clock tree includes a plurality of standard clock trees, and wherein the process returns from said examining to said expanding if a clock tree layout error has occurred.

4. A layout process as defined in claim 2, wherein said examining is followed by generating a layout and modifying the layout.

5. A layout process as defined in claim 1, wherein said connecting is followed by simulating a logic function of said flip-flops.

* * * * *